(12) United States Patent
Chang et al.

(10) Patent No.: US 7,667,219 B2
(45) Date of Patent: Feb. 23, 2010

(54) REDUCED CURRENT PHASE-CHANGE MEMORY DEVICE

(75) Inventors: Heon Yong Chang, Kyoungki-do (KR); Suk Kyoung Hong, Kyoungki-do (KR); Hae Chan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 171 days.

(21) Appl. No.: 11/440,236

(22) Filed: May 24, 2006

(65) Prior Publication Data

US 2007/0075304 A1 Apr. 5, 2007

(30) Foreign Application Priority Data

Sep. 30, 2005 (KR) .................. 10-2005-0092025

(51) Int. Cl.
*H01L 29/02* (2006.01)
*H01L 29/04* (2006.01)
*H01L 29/06* (2006.01)

(52) U.S. Cl. .......... 257/4; 257/2; 257/3; 257/5; 365/163

(58) Field of Classification Search ........... 365/163; 257/2–5, 16, 49, 52–63, 646, 650
See application file for complete search history.

(56) References Cited

U.S. PATENT DOCUMENTS

| | | | |
|---|---|---|---|
| 7,105,870 B2 * | 9/2006 | Lee et al. ................ 257/200 |
| 2005/0110983 A1 * | 5/2005 | Jeong et al. ............. 356/148 |
| 2006/0003470 A1 * | 1/2006 | Chang .................... 438/3 |
| 2007/0034905 A1 * | 2/2007 | Elkins .................... 257/211 |

\* cited by examiner

*Primary Examiner*—Steven Loke
*Assistant Examiner*—Arman Khosraviani
(74) *Attorney, Agent, or Firm*—Ladas & Parry LLP

(57) ABSTRACT

A phase-change memory device more precisely controls electrical current required to accomplish a phase change by using contact holes that extend between phase change layers that are sized differently from each other.

8 Claims, 4 Drawing Sheets

REDUCED CURRENT PHASE-CHANGE MEMORY DEVICE

FIELD OF THE INVENTION

The present invention relates to a phase change memory device and a method of manufacturing the same. More particularly, the present invention relates to a phase-change memory device and a method of making a phase change memory device, in which a contact area between a bottom electrode and a phase-change layer is reduced.

BACKGROUND

As is generally known in the art, semiconductor memory devices are mainly classified into a volatile random access memory (RAM), which loses information stored therein when power is cut off, and non-volatile read only memory (ROM), which continuously retains information stored therein even if power is cut off. Volatile semiconductor RAM includes dynamic RAM (DRAM) and static RAM (SRAM). The non-volatile semiconductor ROM includes flash memory such as an electrically erasable and programmable ROM.

However, as generally known to those skilled in the art, even though the DRAM is a memory device having superior performance, the DRAM stores data using a capacitance effect and therefore it requires relatively high storage capacitance. Since the storage capacity of an electrical capacitor is directly proportional to the spacing between electrodes the material between electrodes and the surface area of the electrodes, DRAMs need relatively large areas just to accommodate the capacitors needed to store charges that represent data. Put another way, as a semiconductor data storage device, the DRAM presents a problem in view of high integration.

Prior art flash memory devices present a different set of problems. Flash memory requires operating voltage higher than supply voltage because the flash memory has a stacked structure of two gates. For this reason, the flash memory device must be equipped with a separate voltage-booster circuit in order to obtain voltages required for writing or erasing operations. In this regard, the flash memory device disturbs high integration of a circuit.

Relatively recent research has developed new highly integrated memory devices having a simple structure that provides a non-volatile memory. One example of a new highly integrated non-volatile memory device is a a phase change RAM device.

A phase change RAM device determines information stored in a cell according to a resistance difference between a crystalline state and an amorphous state of a phase change layer. This phase-change layer is interposed between electrodes and undergoes a phase change from the crystalline state to the amorphous state as current flows between the electrodes.

Phase-change memory devices employ a chalcogenide film as the phase-change layer. The chalcogenide film is a compound material layer consisting of germanium (Ge), stibium (Sb), and tellurium (Te). Electrical current through the material causes it to undergo a phase change between the crystalline state and the amorphous state by reason of Joule heat caused by the electrical current. The phase-change layer has a higher electrical resistance in the amorphous state than in the crystalline state. Information stored in the phase-change memory cell can be either a logic "1" or "0" by detecting the current flowing through the phase-change layer in writing or reading modes.

FIG. 1 is a sectional view of a conventional phase-change memory device.

As shown in FIG. 1, gates 4 are formed on a semiconductor substrate 1, and a junction area (not shown) is formed on the surface of the semiconductor substrate at both sides of the gate 4. An insulating interlayer 5 is formed on the entire surface of the semiconductor substrate 1 in such a manner that the insulating interlayer 5 covers the gates 4. A first tungsten plug 6a and a second tungsten plug 6b are formed at predetermined portions of the insulating interlayer 5 where a phase change cell is formed and a ground voltage (Vss) is applied, respectively.

A first oxide layer 7 is formed on the insulating interlayer 5 including the first and second tungsten plugs 6A and 6B. Although it is not shown in detail, in the first oxide layer 7, a dot-type metal pad 8 is formed in a predetermined area where the phase-change cell is formed, such that the dot-type metal pad 8 is in contact with the first tungsten plug 6A, and a bar-type ground line (Vss line) 9 is formed in a predetermined area to which a ground voltage is applied, such that the bar-type ground line is in contact with the second tungsten plug 6B.

A second oxide layer 10 is formed on the first oxide layer 7 including the metal pad 8 and the ground line 9. A plug-type bottom electrode 11 is formed in a predetermined area of the second oxide layer 10, onto which the phase-change cell will be formed, such that plug-type bottom electrode 11 is in contact with the metal pad 8.

A phase-change layer 12 and a top electrode 13 are sequentially stacked in a predetermined pattern on the second oxide layer 10, so as to be in contact with the bottom electrode 11, thereby forming the phase-change cell including the plug-type bottom electrode 11, phase-change layer 12 and top electrode 13 which have been sequentially stacked.

Then, a third oxide layer 14 is formed on the second oxide layer 10 so as to cover the phase-change cell, and a metal line 15 is formed on the third oxide layer 14 so as to be in contact with the top electrode 13.

Meanwhile, the conventional phase-change memory device requires a very high current (e.g. 1 mA or more) in order to achieve stable phase change. Therefore, in order to decrease the current required for the phase change of the phase-change layer, it is necessary to reduce the contact area between the phase-change layer and the electrodes.

The conventional exposure and etching techniques present limitations to reduce the contact area between the phase-change layer and the electrodes.

In addition, according to the conventional phase-change memory device shown in FIG. 1, although the phase-change layer 12 is in contact with the top electrode 13 as well as the bottom electrode 11, only the area being in contact with the bottom electrode 11 is generally used as a phase-change area because it is impossible to use both of the contact areas as phase-change areas. Accordingly, the phase change of the phase-change layer 12 depends on a contact resistance between the phase-change layer 12 and the bottom electrode 11. However, as described above, because of the limitations of the conventional techniques, it is difficult to stably form the contact area between the phase-change layer 12 and the bottom electrode 11, so that variation of the contact resistance becomes increased, thereby deteriorating reliability of products.

SUMMARY OF THE INVENTION

In light of the foregoing, at least one object of the present invention is to provide a phase-change memory device, in which the contact area between a bottom electrode and a phase-change layer is reduced. In order to accomplish this and other objects, there is provided a phase-change memory device comprising: a semiconductor substrate formed with a lower pattern and a first insulating layer covering the lower pattern; a first electrode formed on the first insulating layer; a second insulating layer formed on the first insulating layer so as to cover the first electrode, and formed with a first contact hole for exposing a predetermined portion of the first electrode; a first phase-change layer formed at an inner portion of the first contact hole and on a predetermined portion of the second insulating layer adjacent to the first contact hole; a third insulating layer formed on the second insulating layer so as to cover the first phase-change layer, and formed with a second contact hole for exposing a predetermined portion of the first phase-change layer; a second phase-change layer formed at an inner portion of the second contact hole; and a second electrode formed on the second phase-change layer and on a predetermined portion of the third insulating layer adjacent to the second phase-change layer, wherein one hole of the first and second contact holes has a relatively larger size.

Herein, the second contact hole may have a size larger than that of the first contact hole, so that a phase change of the first phase-change layer is generated at an interfacial portion between a first portion of the first phase-change layer filled in the first contact hole and a second portion of the first phase-change layer formed on the second insulating layer.

Also, the first contact hole may have a size larger than that of the second contact hole, so that a phase change of the second phase-change layer is generated at an interfacial portion between the first phase-change layer and the second phase-change layer.

The first electrode is a bottom electrode, and the second electrode is a top electrode.

The first phase-change layer and the second phase-change layer are made from materials different from each other.

In accordance with another aspect of the present invention, there is provided a method of manufacturing a phase-change memory device, the method comprising the steps of: forming a first insulating layer on a semiconductor substrate having a lower pattern; forming a first electrode on the first insulating layer; forming a second insulating layer on the first insulating layer so as to cover the first electrode; forming a first contact hole for exposing a predetermined portion of the first electrode by etching the second insulating layer; forming a first phase-change layer at an inner portion of the first contact hole and on a predetermined portion of the second insulating layer adjacent to the first contact hole; forming a third insulating layer on the second insulating layer so as to cover the first phase-change layer; forming a second contact hole for exposing a predetermined portion of the first phase-change layer by etching the third insulating layer; forming a second phase-change layer at an inner portion of the second contact hole; and forming a second electrode on the second phase-change layer and on a predetermined portion of the third insulating layer adjacent to the second phase-change layer, wherein one hole of the first and second contact holes has a relatively larger size.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1:
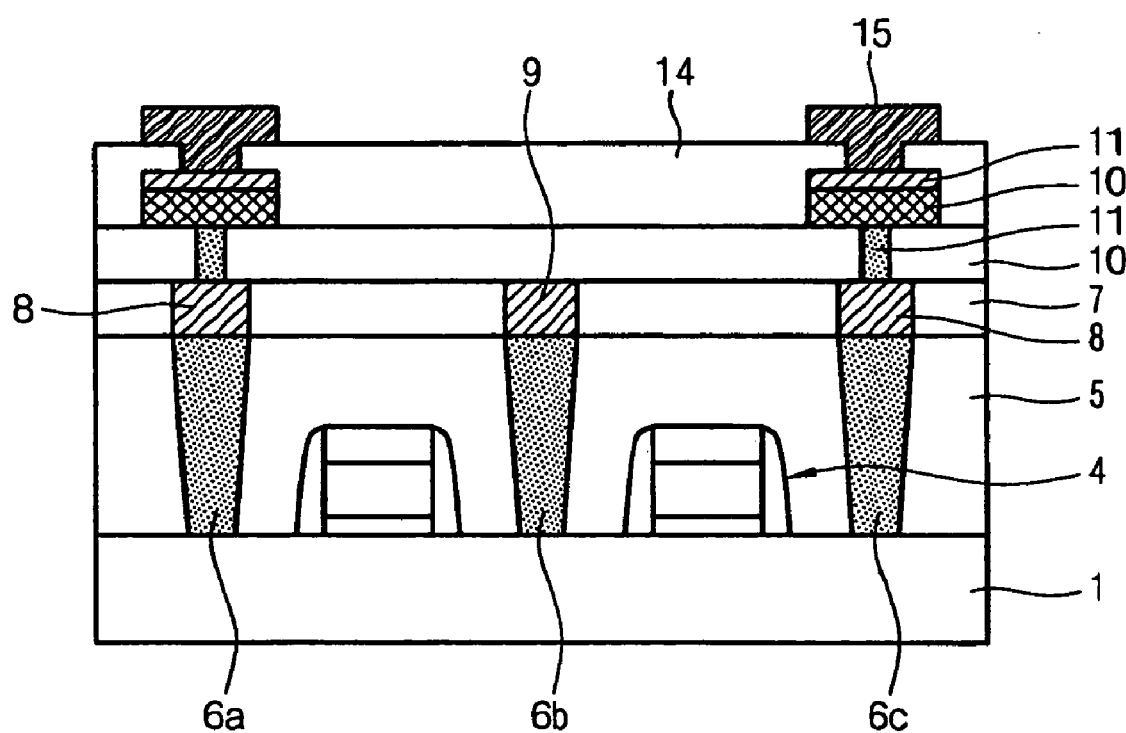
FIG. 1 is a sectional view of a conventional phase-change memory device.

Hereinafter, a preferred embodiment of the present invention will be described with reference to the accompanying drawings. In the following description and drawings, the same reference numerals are used to designate the same or similar components, so repetition of the description on the same or similar components will be omitted.

Figure 2A:
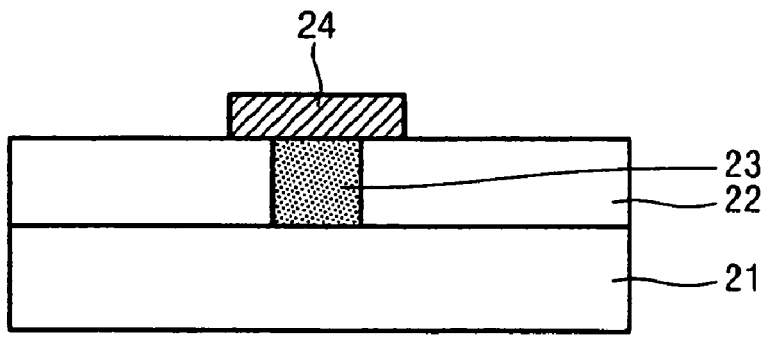
FIGS. 2A to 2D are sectional views for showing a non-volatile memory device and a method of manufacturing a non-volatile phase-change memory device according to an embodiment of the present invention.
Figure 2B:
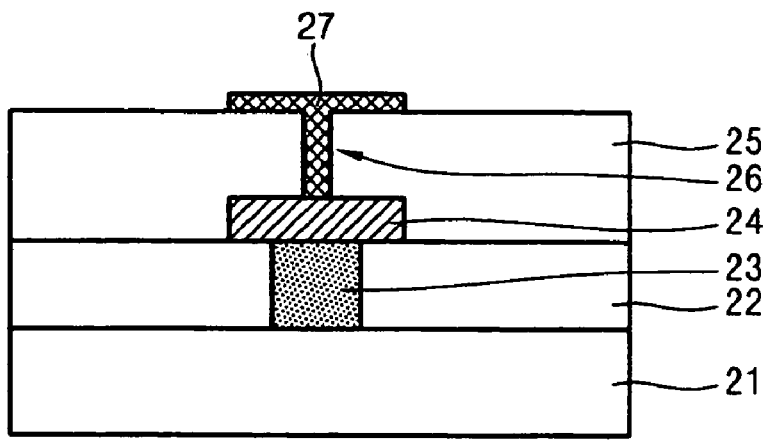
Figure 2C:
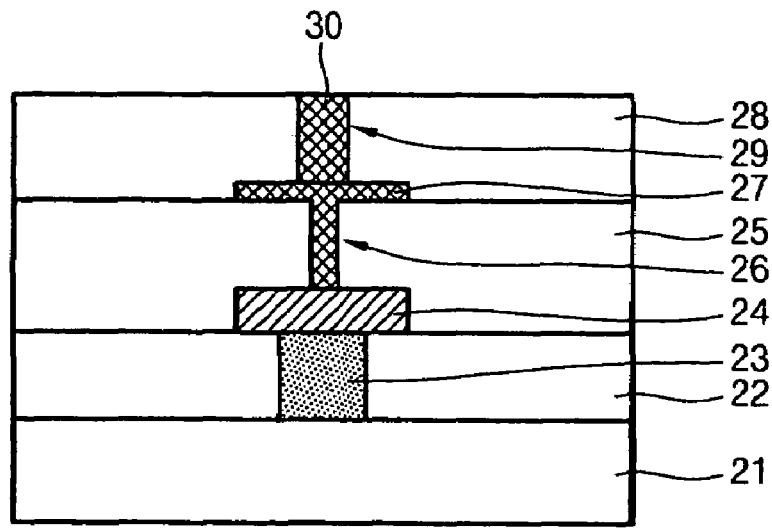
Figure 2D:
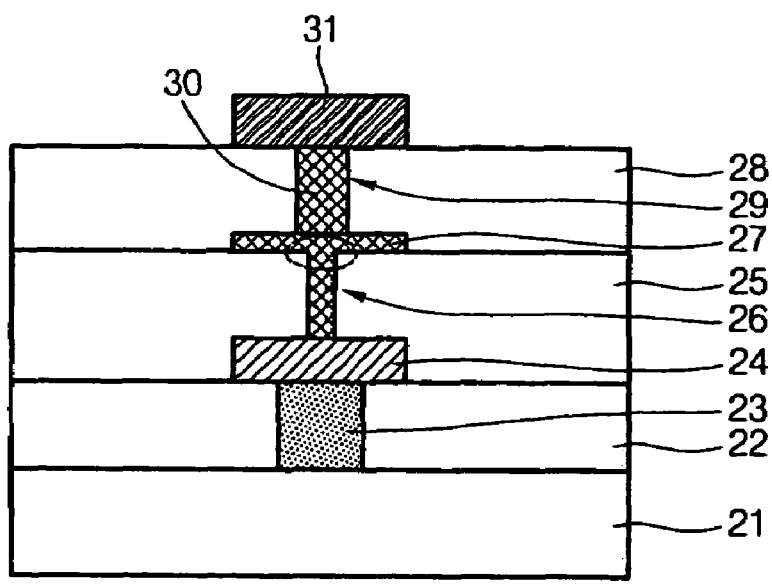

FIGS. 2A to 2D are sectional views for showing a method of manufacturing a phase-change memory device according to an embodiment of the present invention. FIGS. 2A and 2D also show a non-volatile memory device.

Referring to FIG. 2A, after a semiconductor substrate 21 having a lower pattern including a transistor is prepared, a first insulating layer 22 is formed on the semiconductor substrate 21 so as to cover the lower pattern. Then, according to the typical process, a contact plug 23 being in contact with the lower pattern or semiconductor substrate 21 is formed in the first insulating layer 22. Next, a conducting layer is deposited on the first insulating layer 22 including the contact plug 23, and is then subjected to a patterning process so as to form a first electrode (i.e. a bottom electrode) 24 on the contact plug 23 and on a predetermined portion of the first insulating layer 22 adjacent to the contact plug 23.

Referring to FIG. 2B, a second insulating layer 25 is formed on the first insulating layer 22 so as to cover the bottom electrode 24. Next, a first contact hole 26 for exposing a predetermined portion of the bottom electrode 24 by etching the second insulating layer 25. Then, a phase-change material is deposited on the second insulating layer 25 such that the first contact hole 26 is fully filled with the phase-change material, and is then subjected to a patterning process so as to form a first phase-change layer 27 at an inner portion of the first contact hole 26, and on a predetermined portion of the second insulating layer 25 adjacent to the first contact hole 26.

Herein, it can be understood that the first phase-change layer 27 includes a plug-type portion formed at an inner portion of the first contact hole 26, and a layer-type portion formed on the second insulating layer 25. Herein, it is preferred that the layer-type portion formed on the second insulating layer 25 is formed to be as thin as possible due to a need to take into consideration a third insulating layer to be formed in the following process.

Referring to FIG. 2C, a third insulating layer 28 is formed on the second insulating layer 25 so as to cover the first phase-change layer 27. Next, a second contact hole 29 is formed by etching the third insulating layer 28 to exposed a predetermined portion of the first phase-change layer 27. In this case and as shown in FIG. 2C, the second contact hole 29 has a cross-section or size that is larger than that of the first contact hole 26 such that a phase change occurs at a specific portion of the first phase-change layer 27.

Then, a phase-change material is deposited on the third insulating layer 28 such that the second contact hole 29 is fully filled with the phase-change material, and is then subjected to an etch back or CMP (Chemical Mechanical Polishing) process so as to form a second phase-change layer 30 of a plug shape at an inner portion of the second contact hole 29. In this case, it is preferred that the second phase-change layer 30 is made from a material different from that of the first phase-change layer 27.

Referring to FIG. 2D, a conducting layer is deposited on the third insulating layer 28 including the second phase-change layer 30, and is then subjected to a patterning process so as to form a second electrode (i.e. top electrode 31) on the second phase-change layer 30 and a predetermined portion of the third insulating layer 28 adjacent to the second phase-change layer 30.

Thereafter, although it is not shown, a series of typical processes is subsequently performed to complete the phase-change memory device according to an embodiment of the present invention.

According to the phase-change memory device disclosed herein and as described above, since the second contact hole has a size larger than that of the first contact hole, a phase change is generated at a predetermined portion of the first phase-change layer that is located at the interface (an interfacial portion) between a first portion of the first phase-change layer filled in the first contact hole and a second portion of the first phase-change layer formed on the second insulating layer, when the device is driven. This is because the first and second phase-change layers serve as a self-heater (i.e. a resistance component) between the bottom electrode and top electrode, and current profiles applied to the first and second phase-change layers differ from each other.

Therefore, the phase-change memory device disclosed and claimed herein controls a current density (i.e. current profile) of a phase-change layer itself, instead of controlling the contact area between an electrode and a phase-change layer, thereby efficiently reducing a current required for the phase change of the phase-change layer, while not being influenced by the limitations of the exposure and etching techniques.

Figure 3:
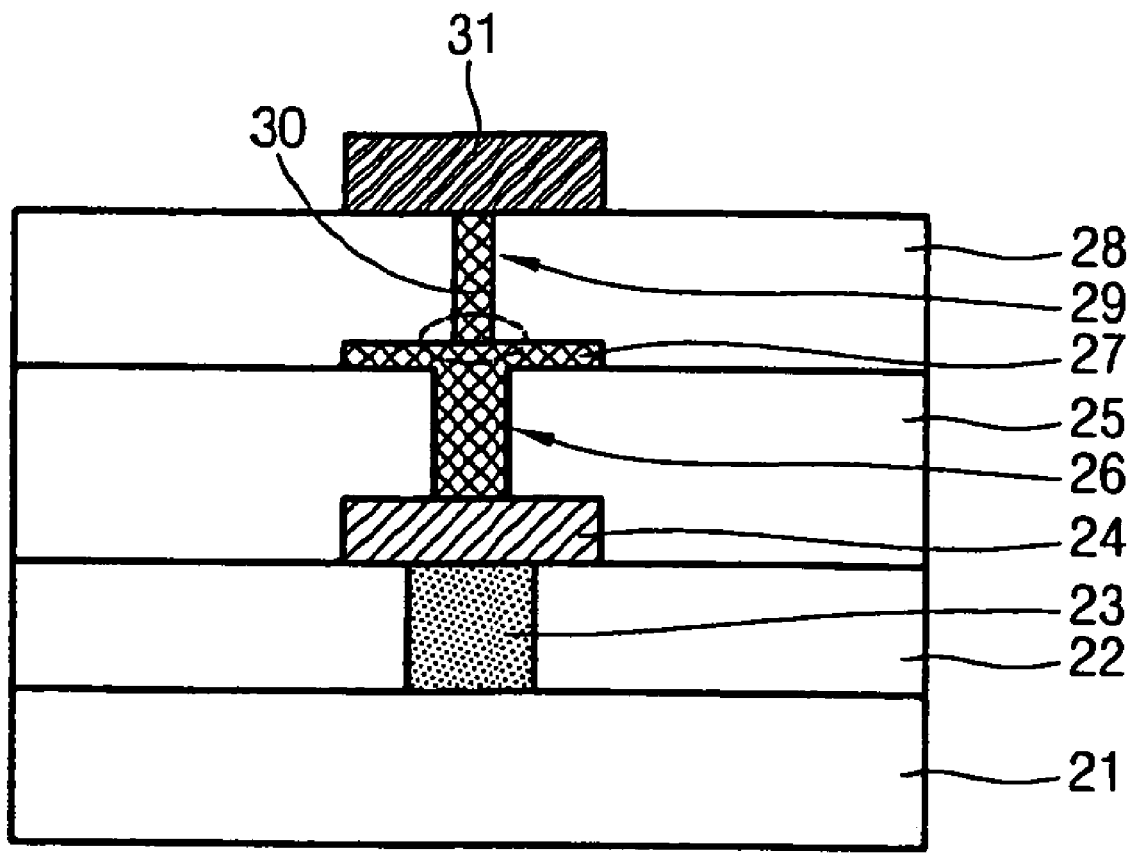
FIG. 3 is a sectional view of a phase-change memory device manufactured according to another embodiment of the present invention.

The present invention has been disclosed in that the second contact hole is formed to have a size larger than that of the first contact hole such that a phase change may occur at a predetermined portion of the first phase-change layer. However, according to another embodiment of the present invention, as shown in FIG. 3, it is also possible to form first and second contact holes 26a and 29a, in which the first contact hole 26a has a size larger than that of the second contact hole 29a. In this case, a phase change of a second phase-change layer 30 is generated at an interfacial portion between a first phase-change layer 27 of a layer shape formed on the second insulating layer 25 and the second phase-change layer 30 formed in a plug shape.

In this case also, it is possible to efficiently reduce a current required for the phase change of the phase-change layer by controlling a current profile, while not being influenced by the limitations of the exposure and etching techniques.

As described above, according to the present invention, a phase-change layer interposed between a bottom electrode and a top electrode is formed so as to have a stacked structure while two stacked layers of the phase-change layer serve as a self-heater (i.e. resistance component). Accordingly, it is possible to efficiently reduce a current required for the phase change of the phase-change layer, while not being influenced by the limitations of the exposure and etching techniques. Accordingly, it is possible to uniformly control the operation of the phase-change memory device, thereby providing the phase-change memory device having high reliability.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change memory device comprising:
a semiconductor substrate formed with a lower pattern;
a first insulating layer covering the lower pattern;
a first electrode formed on the first insulating layer;
a second insulating layer formed on the first insulating layer so as to cover the first electrode, and formed with a first contact hole for exposing a predetermined portion of the first electrode;
a first phase-change layer including both a plug portion formed in the first contact hole and a layer portion formed on a predetermined portion of the second insulating layer adjacent to the first contact hole, such that the first phase-change layer including both the plug portion and the layer portion has a shape of a 'T';
a third insulating layer formed on the second insulating layer so as to cover the layer portion of the first phase-change layer, and formed with a second contact hole for exposing a portion of the layer portion of the first phase-change layer formed over the first contact hole;
a second phase-change layer having a plug shape formed in the second contact hole so as to directly contact the exposed portion of the layer portion of the first phase-change layer formed over the first contact hole; and
a second electrode formed on the second phase-change layer having the plug shape and on a predetermined portion of the third insulating layer adjacent to the second phase-change layer,
wherein a width of the second contact hole having the second phase-change layer formed therein is greater than a width of the first contact hole having the plug portion of the first phase-change layer formed therein, so that a phase-change is generated in the first phase-change layer at an interfacial portion between the plug portion of the first phase-change layer formed in the first contact hole and the layer portion of the first phase-change layer formed over the first contact hole.

2. A phase-change memory device comprising:
a semiconductor substrate formed with a lower pattern;
a first insulating layer covering the lower pattern;
a first electrode formed on the first insulating layer;
a second insulating layer formed on the first insulating layer so as to cover the first electrode, and formed with a first contact hole for exposing a predetermined portion of the first electrode;
a first phase-change layer including both a plug portion formed in the first contact hole and a layer portion formed on a predetermined portion of the second insulating layer adjacent to the first contact hole, such that the first phase-change layer has a shape of a 'T';
a third insulating layer formed on the second insulating layer so as to cover the layer portion of the first phase-change layer, and formed with a second contact hole for exposing a portion of the layer portion of the first phase-change layer formed over the first contact hole;
a second phase-change layer having a plug shape formed in the second contact hole so as to directly contact the exposed portion of the layer portion of the first phase-change layer formed over the first contact hole; and
a second electrode formed on the second phase-change layer having the plug shape and on a predetermined portion of the third insulating layer adjacent to the second phase-change layer,
wherein a width of the first contact hole having the second phase-change layer formed therein is greater than a width of the second contact hole having the plug portion of the first phase-change layer formed therein, so that a phase change is generated in the second phase-change layer at an interface between the layer portion of the first phase-change layer formed over the first contact hole and the second phase-change layer having the plug shape.

3. The phase-change memory device as claimed in claim 1, wherein the first electrode is a bottom electrode, and the second electrode is a top electrode.

4. The phase-change memory device as claimed in claim 1, wherein the first phase-change layer and the second phase-change layer are made from materials different from each other.

5. The phase-change memory device as claimed in claim 2, wherein the first electrode is a bottom electrode, and the second electrode is a top electrode.

6. The phase-change memory device as claimed in claim 2, wherein the first phase-change layer and the second phase-change layer are made from materials different from each other.

7. The phase-change memory device as claimed in claim 1, wherein a width of the second phase-change layer is greater than a width of the plug portion of the first phase-change layer and less than a width of the layer portion of the first phase-change layer.

8. The phase-change memory device as claimed in claim 2, wherein a width of the plug portion of the first phase-change layer is greater than a width of the second phase-change layer and less than a width of the layer portion of the first phase-change layer.

* * * * *